(12) United States Patent
Walker et al.

(10) Patent No.: US 6,868,099 B1
(45) Date of Patent: Mar. 15, 2005

(54) FREQUENCY-NARROWED HIGH POWER DIODE LASER SYSTEM WITH EXTERNAL CAVITY

(75) Inventors: Thad G. Walker, Madison, WI (US); Bien Chann, Madison, WI (US); Ian A. Nelson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 187 days.

(21) Appl. No.: 09/706,088

(22) Filed: Nov. 3, 2000

Related U.S. Application Data

(60) Provisional application No. 60/163,486, filed on Nov. 4, 1999.

(51) Int. Cl.[7] .................................................. H01S 3/10
(52) U.S. Cl. ........................... 372/20; 372/32; 372/102; 372/101; 372/28; 372/19; 372/18
(58) Field of Search ........................ 372/19, 20, 28, 372/32, 101, 102, 18

(56) References Cited

U.S. PATENT DOCUMENTS

| | | | |
|---|---|---|---|
| 3,670,260 A | * | 6/1972 | Koester et al. ................. 372/9 |
| 5,206,878 A | | 4/1993 | Sizer, II |
| 5,289,485 A | | 2/1994 | Mooradian |
| 5,319,668 A | | 6/1994 | Luecke |
| 5,327,447 A | | 7/1994 | Mooradian |
| 5,337,328 A | | 8/1994 | Lang et al. |
| 5,386,426 A | * | 1/1995 | Stephens ..................... 372/101 |
| 5,524,012 A | | 6/1996 | Wang et al. |
| 5,572,542 A | | 11/1996 | Dixon |
| 5,594,744 A | | 1/1997 | LeFevre et al. |
| 5,636,059 A | | 6/1997 | Snyder |
| 5,651,018 A | | 7/1997 | Lang et al. |
| 5,734,672 A | | 3/1998 | McMinn et al. |
| 5,771,252 A | | 6/1998 | Lang et al. |
| 5,860,295 A | * | 1/1999 | Cates et al. .................... 62/637 |
| 5,913,108 A | | 6/1999 | Stephens et al. |
| 6,038,239 A | | 3/2000 | Gabbert |
| 6,584,133 B1 | | 6/2003 | Walker et al. |

FOREIGN PATENT DOCUMENTS

| | | |
|---|---|---|
| EP | 0921614 | 3/2001 |
| WO | WO9633536 A | 10/1996 |

OTHER PUBLICATIONS

Michael G. Littman, et al., "Spectrally Narrow Pulsed Dye Laser Without Beam Expander," Applied Optics, vol. 17, No. 14, Jul. 15, 1978, pp. 2224–2227.

W.F. Sharfin, et al., "High–Power, Diffraction–Limited, Narrow–Band, External–Cavity Diode Laser," App. Phys. Lett., vol. 54, No. 18, May 1, 1989, pp. 1731–1733.

Carl E. Wieman, et al., "Using Diode Lasers for Atomic Physics," Rev. Sci. Instrum., vol. 62, No. 1, Jan., 1991, pp. 1–20.

(List continued on next page.)

*Primary Examiner*—Jerome Jackson
*Assistant Examiner*—Matthew C. Landau
(74) *Attorney, Agent, or Firm*—Foley & Lardner

(57) ABSTRACT

A high power diode laser system utilizes an external cavity to narrow the spectral width of a high power multimode diode laser to change the output power normally produced by the diode from a broad spectrum to a very narrow spectrum. The power output of the laser system is concentrated over a narrow spectral range which falls within the useable range for particular applications, such as optical pumping of noble gas samples for magnetic resonance imaging. The output of the diode is received by a collimating element which directs the light on a beam path to a diffraction grating which is oriented at an angle to the incident beam. A portion of the beam may be directed from the diffraction grating to provide useable output light, and a portion of the light incident on the grating is directed back to be focused on the diode to provide feedback to cause the diode to preferentially lase at the wavelength of the light that is fed back. A polarization rotation element may be used to orient the polarization of the light passing through it to control the amount of feedback light.

11 Claims, 4 Drawing Sheets

OTHER PUBLICATIONS

Chi–Luen Wang, et al., "Tunable Dual–Wavelength Operation of a Diode Array with an External Grating–Loaded Cavity," Appl. Phys. Lett., vol. 64, No. 23, Jun. 6, 1994, pp. 3089–3091.

E.R. Brown, et al., "Milliwatt Output Levels and Superquadratic Bias Dependence in a Low–Temperature–Grown GaAs Photomixer," App. Phys. Lett., vol. 64, No. 24, Jun. 1994, pp. 3311–3313.

Thad G. Walker, et al., "Spin–Exchange Optical Pumping of a Noble–Gas Nuclei," Rev. of Modern Physics, vol. 69, No. 2, Apr. 1997, pp. 629–642.

A.K. Goyal, et al., "Stable Single–Frequency Operation of a High–Power External Cavity Tapered Diode Laser at 780 nm," Appl. Phys. Lett., vol. 71, No. 10, Sep. 8, 1997, pp. 1296–1298.

A. Ben–Amar Baranga, et al., "Polarization of 3He by Spin Exchange with Optically Pumped Rb and K Vapors," Physical Review Letters, vol. 80, No. 13, Mar. 30, 1998, pp. 2801–2804.

Ming–Wei Pan, et al., "Fiber–Coupled High–Power External–Cavity Semiconductor Lasers for Real–Time Raman Sensing," Applied Optics, vol. 37, No. 24, Aug. 20, 1998, pp. 5755–5799.

Ming–Wei Pan, et al., "Spatial and Temporal Coherence of Broad–Area Lasers with Grating Feedback," J. Opt. Soc. Am. B, vol. 15, No. 10, Oct., 1998, pp. 2531–2536.

Torkild Eriksen, et al., "Rocketborne Rayleigh Lidar for in situ Measurements of Neutral Atmospheric Density," Applied Optics, vol. 38, No. 12, Apr. 10, 1999, pp. 2605–2613.

L. Hsu, et al., "Frequency Tracking and Stabilization of a Tunable Dual–Wavelength External–Cavity Diode Laser," Optics Communications, vol. 168, Sep. 1, 1999, pp. 195–200.

V. Daneu, et al., "Spectral Beam Combining of a Broad–Stripe Diode Laser Arrya in an External Cavity," Optics Letters, vol. 25, No. 6, Mar. 15, 2000, pp. 405–407.

Martin Lobel, et al., "Tunable single–mode operation of a high–power laser–diode array by use of an external cavity with a grating and photorefractive phase–conjugate mirror," J. Opt. Soc. Am. B, vol. 15, No. 7, Jul. 1998, pp. 2000–2005.

Hiroyuki Asakura, et al., "External cavity semiconductor laser with a Fourier grating and an aspheric lens," Applied Optics, vol. 32, No. 12, Apr. 20, 1993, pp. 2031–2038.

R. J. Jones, et al., "Near–diffraction–limited high Power (~1 W) single longitudinal mode CW diode laser tunable from 960 to 980 nm," IEE, Aug. 9, 1995.

P. Gavrllovič, et al., "High–power grating tuned semiconductor diode lasers and single–frequency diode–pumped Nd:YAG microcavity lasers," Joint Soviet–American Workshop on the Physics of Semiconductor Lasers, May 20–Jun. 3, 1991, pp. 37–48.

T. Earles, et al., "Narrow spectral width (< Å FWHM), 1.1–W cw operation from 100–$\mu$m stripe DFB diode lasers ($\lambda$=0.893 $\mu$m) with Al–free optical–confinement region," CLEO 1998, Monday Morning, pp. 38–39.

Gabriele Ferrari, et al., "High–power multiple–frequency narrow–linewidth laser source based on a semiconductor tapered amplifier," Optics Letters, vol. 24, No. 3, Feb. 1, 1999, pp. 151–153.

Mats Hagberg, et al., "5–W 930–nm tunable external–cavity laser," CLEO 1998, Monday Morning, p. 40–41.

Haim Lotem, et al., "Tunable dual–wavelength continuous–wave diode laser operated at 830 nm," Applied Optics, vol. 32, No. 27, Sep. 20, 1993, pp. 5270–5273

D. Wandt, et al., "External cavity laser diode with 40 nm continuous tuning range around 825 nm," Optics Communications, vol. 130, Sep. 15, 1996, pp. 81–84.

B. Chann et al, "Frequency–narrowed–external–cavity diode–laser–array bar," Optics Letters, vol. 25, No. 18, Sep. 15, 2000, pp. 1352–1354.

I.A. Nelson, et al., "Spin–exchange optical pumping using a frequency–narrowed high power diode laser," Applied Physics Letters, vol. 76, No. 11, Mar. 13, 2000, pp. 1356–1358.

Haim Lotem, et al., "Tunable external cavity diode laser that incorporates a polarizatin half–way of plate," Applied Optics, vol. 31, No. 36, Dec. 20, 1992, pp. 7530–7532.

* cited by examiner

FREQUENCY-NARROWED HIGH POWER DIODE LASER SYSTEM WITH EXTERNAL CAVITY

CROSS-REFERENCE TO RELATED APPLICATION

This application claims the benefit of provisional application No. 60/163,486, filed Nov. 4, 1999, the disclosure of which is incorporated by reference.

REFERENCE TO GOVERNMENT RIGHTS

This invention was made with United States government support awarded by the following agency: NSF 9724172. The United States government has certain rights in this invention.

FIELD OF THE INVENTION

This invention pertains generally to the field of diode lasers and particularly to high power diode laser systems.

BACKGROUND OF THE INVENTION

High power diode laser arrays are now in use for a variety of technological applications. Commercially available diode array systems with high output power (greater than 1 watt) are currently relatively expensive. Although the cost of such systems is likely to decrease over time, a typical current cost for a 15 watt diode array is in the range of $25,000. Clearly, the users of such arrays wish to have as much usable laser light as possible. Unfortunately, much of the light that is emitted is not usable for many applications.

One important use of high power diode lasers is for producing laser polarized noble gases for medical magnetic resonance imaging (MRI). As an example, a 15 watt laser array can be used to optically pump the noble gas sample. The user tunes the array to a wavelength at which the gas in the cell is activated, e.g., 795 nanometers (nm) where rubidium is used. Unfortunately, like all high power diode laser systems now available, the laser not only puts out laser light at the desired 795 nm, but also a spread of wavelengths around 795 nm. While the peak of the spectrum may be at 795 nm, the 15 watts of output power is typically spread over several nanometers, typically displaying a Gaussian-type curve of laser power versus wavelength centered at the desired wavelength. Thus, only a fraction of the 15 watts of output power is usable by the cell. Under reasonably attainable conditions, generally only the light which is between about 794.9 and 795.1 nanometers is useful. The vast majority of the output power of the laser is outside this range and is wasted; typically of the 15 watts of power produced by the laser system, only 1 or 2 watts may fall within the useful range.

SUMMARY OF THE INVENTION

In accordance with the present invention, a high power diode laser system utilizes an external cavity to narrow the spectral width of a high power diode laser having a multimode output to change the output power normally produced by the laser from a broad spectrum to a very narrow spectrum, so that more power is concentrated over a narrow spectral range which falls within the usable range for a particular application, such as optical pumping of noble gas samples for MRI. The total power output of the laser system is reduced a moderate amount from the output power provided from the laser alone, but concentrated within the narrow spectral range to provide a much higher equivalent power laser system. For example, a 4 watt output laser may have its output power narrowed in spectral width to provide 3 watts of output power in a usable narrow spectral range, providing more usable output power in the desired spectral range of interest than a much more expensive 15 watt laser.

The laser system in accordance with the present invention includes a high power diode laser comprising a diode emitter that by itself produces laser light output at power levels of at least one watt having a relatively broad multimode spectral range typical of commercially available high power diode lasers. The output of the laser is received and collimated by a collimating element such as a lens(es) or reflector(s), and the collimated beam may be passed through a polarization rotation element such as a half-wave plate before being incident upon a diffraction grating oriented at an angle to the incident beam. A portion of the light incident on the grating is directed back through the half-wave plate and the collimating lens and is then focussed back on the laser diode emitter, providing feedback thereto. A portion of the beam may be directed from the diffraction grating to provide usable output light of the laser system or otherwise directed out of the cavity. The diffraction grating is oriented to feed back the light at a selected wavelength to the laser, causing the laser diode emitter to preferentially lase at the wavelength of the light that is fed back. Surprisingly, despite the normal multimode output of the high power diode laser, it is found in accordance with the invention that the output beam of the system has a much narrower spectral width. The diffraction grating may also be arranged in a Littman-Metcalf configuration, with the light directed from the grating to a mirror and back to the grating to form the light fed back to the laser. The half-wave plate may be used to orient the linear polarization of the light passed therethrough. The half-wave plate may be mounted for rotation, e.g., about an axis parallel with the output beam from the laser. By rotating the half-wave plate, the polarization of the light can be set to any desired direction, allowing the level of feedback of light to the diode to be adjusted. The polarization of the light striking the diffraction grating affects the efficiency of the diffraction grating and thereby the amount of light that is directed back by the diffraction grating to the laser diode. Excessive feedback would potentially destroy the diode (e.g., for some high power diodes, the diode would be destroyed if 30 percent or more of its power were to be fed back to it). The polarization rotation element may thus be used where the laser light that would otherwise be fed back would be excessive. By adjusting and setting the level of feedback, it is possible to obtain the maximum tunability, maximum output power, or a combination of both, depending on the particular laser application.

Further objects, features and advantages of the invention will be apparent from the following detailed description when taken in conjunction with the accompanying drawings.

DETAILED DESCRIPTION OF THE INVENTION

Figure 1:
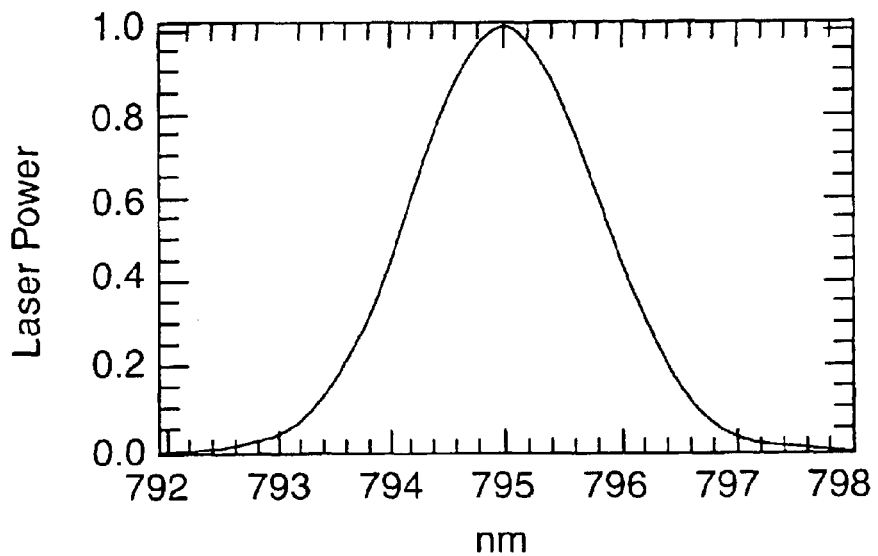
FIG. 1 is a diagram illustrating the typical spectral spread of laser power in a typical high power unnarrowed laser diode.

High power diode lasers, specifically, lasers with output powers greater than 1 watt, are much more expensive than low power diode lasers (generally, tens of milliwatts output power or less). For certain applications, however, the greater power output available from such high power lasers is essential. An example is in the production of laser-polarized noble gases for medical magnetic resonance imaging. However, the commercially available high power diode lasers provide their output power spread over a fairly wide spectral range, as illustrated in FIG. 1. In contrast to low power diode lasers, which have a single transverse mode, high power diode lasers have multiple transverse modes. Although the output laser spectrum of the high power laser may be centered at a particular wavelength (e.g., 795 nm as illustrated in FIG. 1), the output power may be spread over several nanometers, typically with a Gaussian distribution as shown in FIG. 1. For many applications, including the production of laser polarized noble gas, only a narrow spectral range of output power is usable. For example, for laser polarizing of noble gases, the usable spectral range of output power is roughly between 794.9 and 795.1 nm. With an output power spectrum as illustrated in FIG. 1, it is seen that the vast majority of the laser light is not usable and is essentially wasted. Thus, although a laser of this type may have a rated output power of 15 watts, the usable output power is only a fraction of that, perhaps only 1 or 2 watts.

Figure 2:
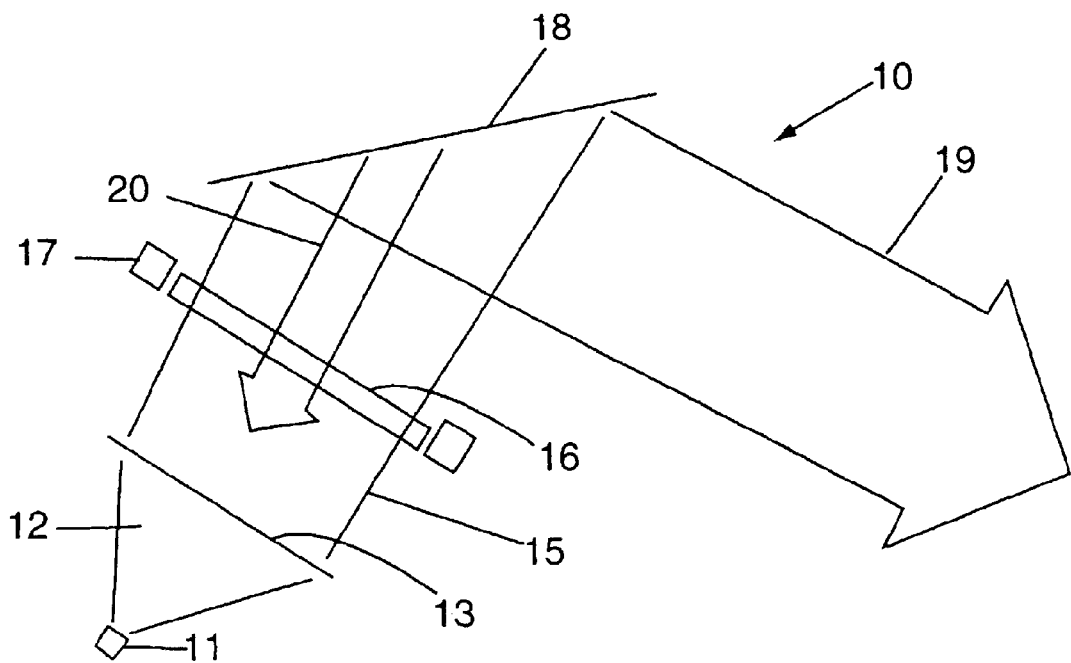
FIG. 2 is a schematic diagram of the frequency narrowed high power diode laser system with an external cavity in accordance with the present invention.

A high power diode laser system which yields greatly improved usable power output in a narrow wavelength range in accordance with the present invention is illustrated generally at 10 in FIG. 2. The laser system 10 includes a high power single emitter laser diode 11 which may be a commercially available laser diode having a relatively high power multimode output, e.g., greater than 1 watt and for currently available commercial devices typically in the 3 to 4 watt range, which provides an expanding output beam 12 from its output aperture. Suitable single emitter laser diodes are available commercially from Coherent Semiconductor Group (single stripe CW devices in the 780 to 800 nm range), and Semiconductor Laser International (SLI) (e.g., 5 watts SL1-CW-xxx-C1-xxx-5M-4). The expanding beam 12 is collimated by a collimating element 13 (e.g., a reflecting mirror or a lens as shown) into a collimated beam 15. An example of a collimating lens that may be utilized with various commercial lasers is a 0.68 numerical aperture (NA) aspheric lens. The beam 15 is passed through a polarization rotation element such as a half-wave plate 16. After passing through the half-wave plate 16, the beam 15 is incident upon a diffraction grating 18 which is oriented at an angle to the incident beam 15. Part of the beam 15 is directed by the grating 18 into an output beam 19 which can be used for various purposes, e.g., laser polarizing of noble gases. The diode laser 11 is preferably oriented with the long axis of its active region parallel to the grooves of the grating. The diffraction grating 18 is formed to selectively direct a very narrow range of wavelengths of light back in a beam 20 which passes through the half-wave plate 16 and is focussed by the collimating lens 13 onto the output aperture at the face of the laser diode 11. An example of a grating that may be used with various commercial lasers is an 1800 lines/mm holographic diffraction grating. The efficiency of the diffraction grating in diffracting the incident light passed through the half-wave plate 16 is dependent upon the angle of polarization of the light passed through the half-wave plate 16. The half-wave plate 16 is mounted for rotation on a rotatable mount 17, e.g., of conventional design for rotating optical elements such as lenses, so that it can be rotated about a central axis which is parallel with the beam 15. The light from the diode laser is linearly polarized and the polarization rotation element half-wave plate 16 changes the orientation of the polarization depending on the orientation of the plate. By rotating the half-wave plate 16 about its mount 17, the polarization of the light incident upon the diffraction grating can be selected and thereby the efficiency of the grating can be selected. In this manner, the amount of light that is directed back by the diffraction grating to the laser diode can be controlled. The light in the beam 20 fed back to the laser diode causes the laser diode 11 to preferentially lase at the wavelength of the light from the diffraction grating, with the result that the light in the beam 15 and the light 19 that is reflected from the diffraction grating 18 have a greatly narrowed spectral spread as compared to the light normally emitted from the laser diode 11. For example, for a commercially available 4 watt diode with a spectral spread of 2 nm, by utilizing the apparatus of FIG. 2 the spectral width can be reduced to approximately 0.06 nm.

Because the half-wave plate 16 is mounted for rotation, the rotational position of the half-wave plate can be adjusted to adjust the feedback to obtain maximum tunability, maximum output power, or a combination of both depending on the desired application for the laser. The utilization of the half-wave plate 16 allows the amount of light fed back from the diffraction grating 18 in the beam 20 to be adjusted so that the laser diode 11 is not damaged (typically less than 30 percent of the power should be fed back to the laser diode), while allowing the efficiency of the output of the system to be maximized. The half-wave plate 16 may for some applications be fixed at the appropriate position for the desired level of feedback.

As an example of the application of the present invention, a frequency narrowed 2.5 watt diode laser having an equipment cost of approximately $5,000 can be applied to xenon gas in a conventional cell to produce laser-polarized xenon gas for MRI applications at an efficiency 50 percent greater than that of a commercially available 15 watt diode array having a cost of approximately $25,000. A frequency narrowed 4 watt diode that costs only a few hundred dollars more than a 2 watt diode may be utilized in an array of 3 or 4 such lasers to replace the approximately 100 watt diode arrays currently utilized for industrial production of polarized noble gas, which have a present cost of approximately $100,000.

Figure 3:
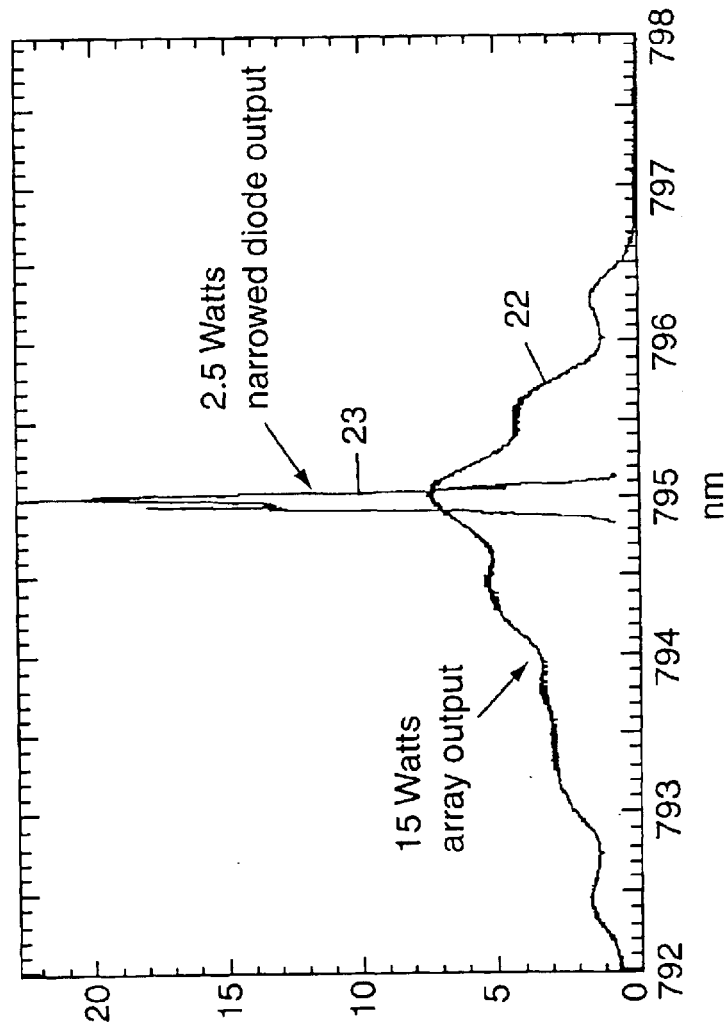
FIG. 3 are diagrams of measured spectral spread for a 15W Optopower array and for a 4W frequency narrowed high power diode laser system.

FIG. 3 shows the measured output spectrum 22 of a 15 watt Optopower array and the measured output spectrum 23 of a 4 watt frequency-narrowed external cavity diode laser system in accordance with the invention. The array spectrum 22 was measured with a grating spectrometer and the spectrum 23 of the external cavity laser system was measured with a custom-made Fabry-Perot spectrometer. As illustrated in FIG. 3, the 4 watt external cavity laser system has significantly higher output power in the desired narrow range around 795 nm than the 15 watt array.

The half-wave plate 16 is a preferred polarization rotation element for adjusting the polarization of the light passed through to the grating 18. However, other equivalent structures may be utilized, including two quarter wave plates or appropriate polarizer material.

Figure 6:
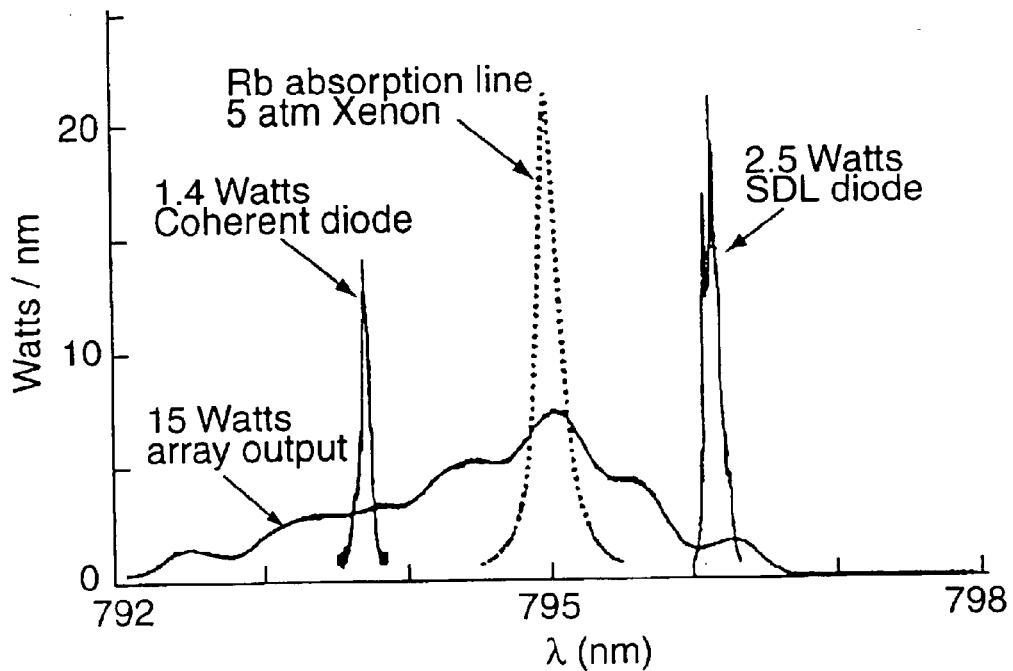
FIG. 6 are diagrams of measured spectral spread for a 15 W laser diode array and for a frequency narrowed diode laser system using commercial laser diodes.

As a further example, using a Coherent Semiconductor Group 2 W BAL (SS-79-2000C-150-H) laser diode, 1.4 W with a 0.08 nm bandwidth was obtained as shown in FIG. 6. The spectral shapes were measured as discussed above, and the measured peaks are shown shifted from 795 nm for clarity. The output frequency tuned smoothly from approximately 792 to 798 nm, and ran stably for days without requiring adjustment or realignment. No temperature control of the external cavity was used, and the components were mounted on low-cost commercial mounts. Similar results were attained with a 4 W Semiconductor Laser International BAL at 808 nm (SLI-CW-SLD-C1-808-4M-R).

Figure 4:
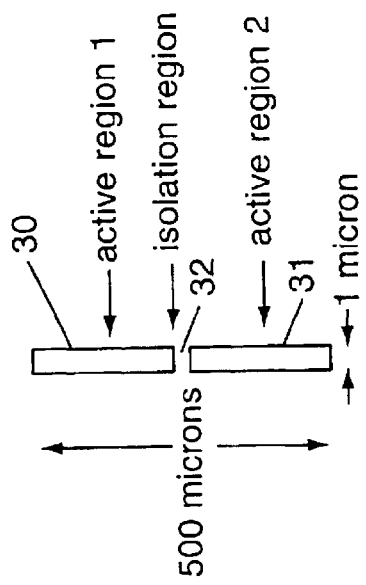
FIG. 4 is a simplified diagram illustrating the construction of one type of high power diode laser.

For some types of commercial lasers that provide a non-uniform output beam, compensating lenses may be required in the beam path 15. This may include a cylindrical lens to compensate for astigmatism in the laser output beam. Certain types of high power lasers may produce two laser beams or may be composed of two lasers adjacent to each other, so that proper collection of the light emitted from the lasers, and proper focussing of the feedback light onto the facets of the lasers, may require compensating lenses of this type. Further, two frequencies may be produced from a single laser diode (e.g., a Spectra Diode Labs SDL-2380 series) in which the, e.g., 4 Watt diode, is actually two (2 Watt) diodes 30 and 31 separated by a small isolation region 32 as shown in FIG. 4.

Figure 5:
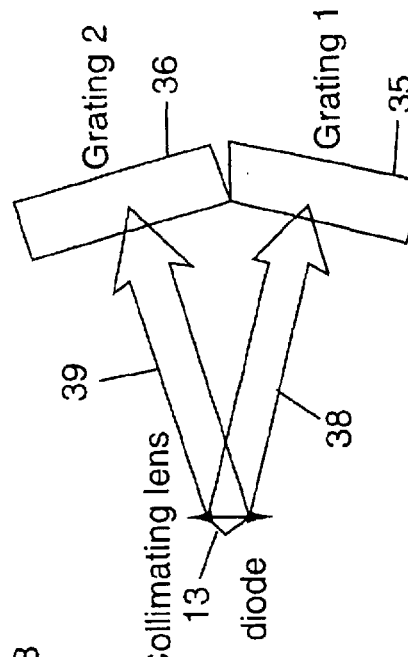
FIG. 5 is a diagram illustrating an arrangement of gratings in accordance with the invention for use with the diode laser constructed as in FIG. 4.

The first difficulty in working with such a diode is the beam shape owing to the tall, narrow active regions—the angular divergence of the beam is 34° in the horizontal direction (as pictured in FIG. 4) compared to only 12° in the vertical direction, and it is not possible to collimate both directions with spherical lenses. A single 6 mm focal length spherical collimating lens may be used to collimate the beam in the horizontal direction. The vertical direction then continues to diverge at an angle somewhat smaller than 12°. By inserting a single 1800 lines/mm grating to form an external feedback cavity, the light may be fed back from either region 1 or region 2, but not both simultaneously (due to the remaining divergence of the beam in the vertical direction). Further, when the light is fed back from region 1, only region 1 is narrowed and tunable. Similarly, when the tilt of the grating is adjusted to feed back the light from region 2, only region 2 is narrowed and tunable. In accordance with the invention, the first grating 35 may be moved and a second grating 36 added so as to form two separately tunable external cavities as shown in FIG. 5. The first grating 35 intercepts only the light 38 from region 1 and the second grating 36 intercepts only the light 39 from region 2. The two output beams thus formed are separately tunable over approximately 4 nm and both can be narrowed to approximately 1 Angstrom line width. Each contains roughly 1 Watt of output power.

A device for generating tunable terahertz radiation may utilize this structure. By focusing both outputs onto an ultrafast photodetector, oscillations may be induced at a frequency equal to the difference of the frequencies of the two outputs. This difference is tunable by changing the angle of one of the two gratings while holding the other fixed.

A single, narrowed output beam may also be produced from a two emitter laser diode (e.g., SDL-2380). Each active region may be fed back to itself using a single grating and a cylindrical lens. The cylindrical lens is placed in the a cavity not to collimate the vertical beam direction but to focus it onto the grating. In this way, an erect image of the output aperture of the diode (with its two active regions) is produced back on the diode, so that region 1 is fed back to region 1 and region 2 to region 2. For example, a single 2.5 watt output beam may be narrowed to 70 GHz (1.5 Angstroms) line width. If the cylindrical lens is placed to collimate the light (as is customary with single active region, lower power diodes), the image produced on the diode is inverted-region 1 is fed back to region 2 and vice versa and with less satisfactory results.

Figure 7:
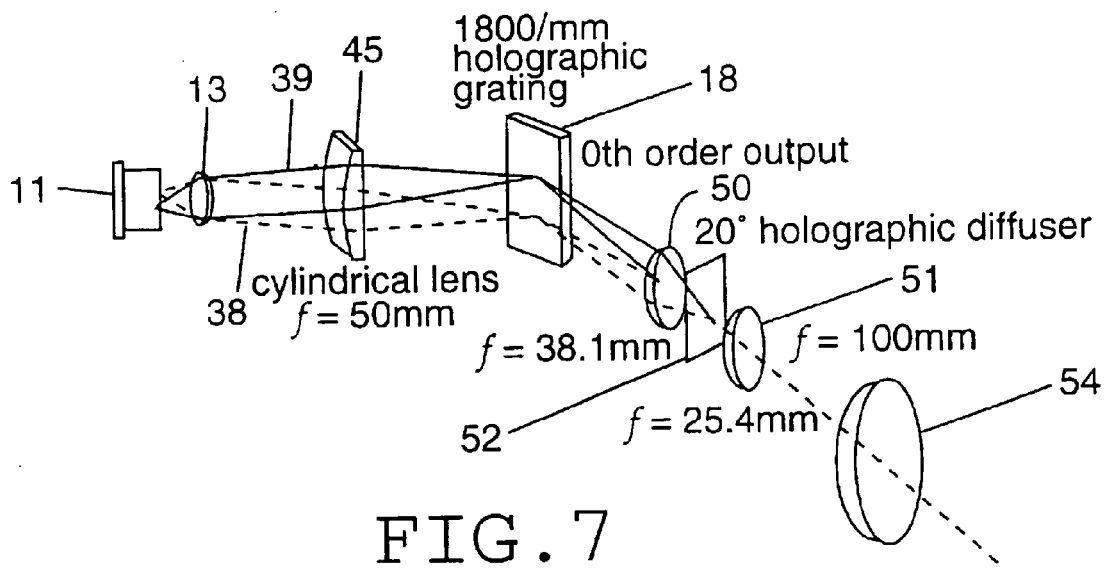
FIG. 7 is a schematic diagram of a laser diode system that may be used with a diode having two active regions.

A diode laser system utilizing this arrangement is shown in FIG. 7. A cylindrical lens 45 is inserted into the cavity between the collimating element (e.g., lens 13) and the grating 18 to allow narrowing and tuning of both active regions with one grating. Rather than collimating the laser light, the lens 45 images the output aperture of the diode 11 onto the grating 18. In this way, the first order diffraction feedback forms an image of the diode output back onto itself with positive unit magnification (in contrast to the negative magnification that occurs in a standard Littrow cavity). The result is that each of the two active regions is imaged back onto itself, rather than onto the other. In this way, a 2.5 W output beam has been produced with 70 GHz full width at half maximum, tunable over roughly 4 nm, as illustrated in FIG. 6 (the measured peaks are shown displaced from 795 nm for clarity of illustration). Note that for this particular commercial diode laser, light is polarized along the quickly diverging direction, and adding the half-wave plate 16 to the cavity only allows an increase in feedback, resulting in lower power output with only modest gains in narrowing and tunability.

The optical pumping performance of the frequency narrowed 4 W diode system of the invention was compared to a commercially available 15 W diode array (OPC-A015-FCPS, Opto Power Corporation). The optical pumping cell used is a sealed uncoated Pyrex 4 cm diameter sphere with a small stem. It contains 1.3 amagats of natural abundance Xe, 50 torr of nitrogen quenching gas, and a small amount of Rb metal. It is located inside a forced air oven with an antireflective coated window, and is carefully centered in a pair of 1 m diameter Helmholtz coils which provide the dc field. A custom pulsed nuclear magnetic resonance (NMR) system measured the relative polarization of the $^{129}$Xe in the cell using free-induction decay following a $\pi/2$ resonant pulse. To compare the performance of the narrowed diode and the array, the polarization of the Xe was measured as a function of the oven temperature. Each of the two laser sources was used to illuminate the cell with a uniform 2 cm diameter beam. The irregular beam profile of the narrowed diode necessitated the use of beam-shaping optics shown in FIG. 7, i.e., additional lenses 50 and 51 were used with a holographic diffuser 52 and a final lens 54 on the output beam. Losses at the optics led to only 1.4 W actually being delivered to the cell. Nevertheless, the maximum polarization achieved with the 1.4 W narrowband laser is nearly identical to that of the 15 W array. Removing the beam shaping optics results in even higher Xe polarizations because the entire 2.5 W is delivered to the cell. The narrowband 2.5 W laser then produces polarizations 40% greater than that of the 15 W array.

Figure 8:
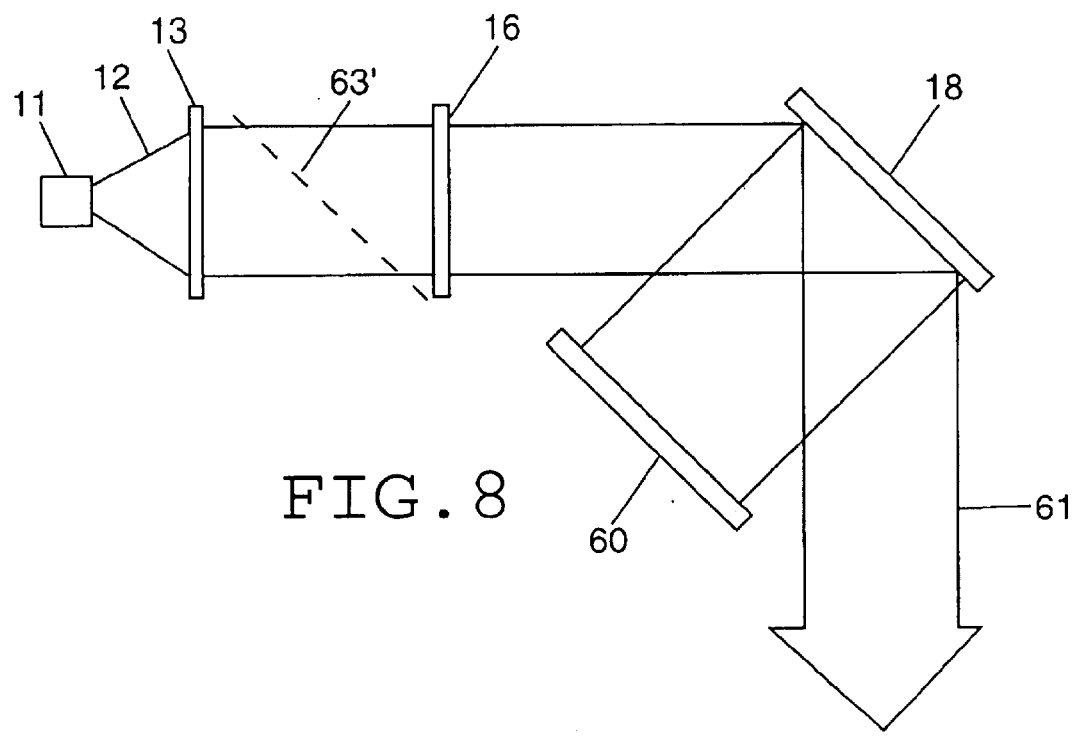
FIG. 8 is a schematic diagram of a diode laser system in accordance with the invention having a Littman-Metcalf cavity configuration.

The invention may also be embodied in a system with a Littman-Metcalf external cavity as illustrated in FIG. 8. In this arrangement, the collimated beam incident on the grating 18 is directed to a mirror 60 which reflects the light back to the grating. A portion of the light is directed by the grating back on the beam path to be focussed on the emitter of the diode laser 11. A portion of the light may also be directed by the grating to provide a useable output beam 61 as shown in FIG. 8.

Figure 9:
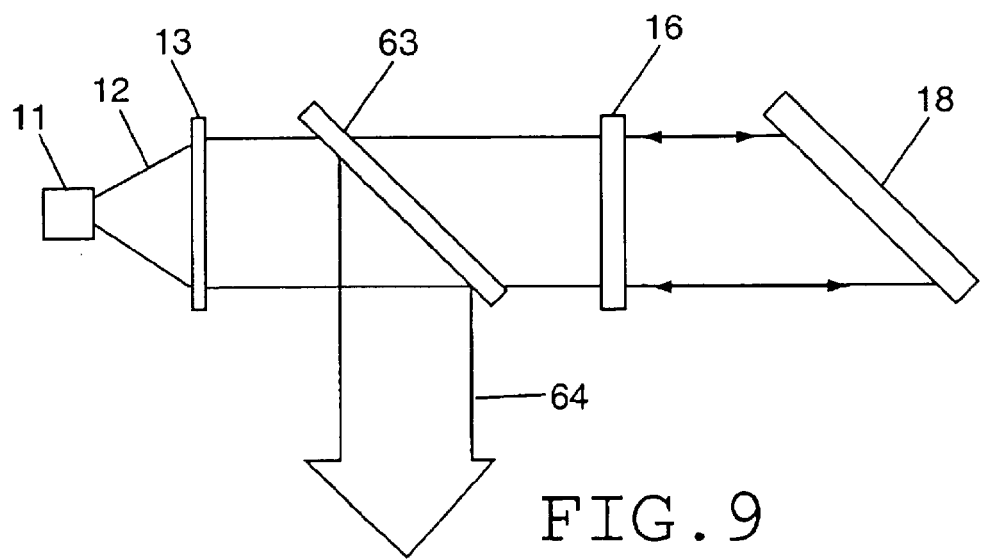
FIG. 9 is a schematic diagram of a diode laser system similar to that of FIG. 1 but with the output beam directed out of the cavity with a beam splitter.

It is noted that the output beam from the system can be directed out of the cavity other than by the diffraction grating. FIG. 9 illustrates a Littrow cavity arrangement, similar to that of FIG. 1 (with the same parts bearing the same numerals), in which a beam splitter 63, preferably non-polarizing, is mounted in the beam path between the collimating element 13 and the grating 18. The beam splitter 63 partially reflects the light from the laser 11 into an output beam 64 that exits the cavity, and partially transmits the laser light through the element 63 to the grating 18 and thence back on the beam path through the beam splitter 63 to be focussed onto the emitter of the laser 11. Similarly, a beam splitter may be inserted in the beam between the collimating element 13 and the grating 18 in the Littman-Metcalf configuration of FIG. 8 to form the output beam, as indicated at 63' in FIG. 8.

The frequency narrowed output is well suited to laser polarization of gases, including the noble gases, e.g., xenon, helium, mixtures of xenon and rubidium, mixtures of helium and rubidium, mixtures of cesium and xenon, and mixtures of potassium and helium.

It is understood that the foregoing description is for purposes of exemplifying the invention and that modifications of these embodiments may be made without deviating from the scope of the present invention, which is set forth in the accompanying claims.

What is claimed is:

1. A high power diode laser system having narrow spectral width output comprising:
    (a) a high power diode laser that produces multimode laser light output at power levels of at least one watt and having a relatively broad spectral range;
    (b) a collimating element positioned to receive the output of the laser diode and provide a collimated output beam; and
    (c) a diffraction grating mounted to receive the collimated beam from the collimating element on a beam path, the diffraction grating oriented at an angle to the collimated beam such that a portion of the light in the collimated beam incident on the grating is directed back on the beam path to the collimating element and is focussed on the diode laser to provide feedback thereto to narrow the spectral range of the laser light output; and
    (d) a polarization rotation element in the beam path from the collimating element to the diffraction grating, the polarization rotation element oriented such that the light on the beam path passed therethrough to the diffraction grating is oriented with respect to the diffraction grating to provide a selected efficiency of the diffraction grating and to select the amount of light directed back by the diffraction grating toward the diode laser to provide effective feedback without damaging the diode laser, wherein the polarization rotation element is mounted for rotation to allow rotation of the polarization rotation element to select the amount of feedback to the diode laser.

2. The laser system of claim 1 wherein the polarization rotation element is a half wave plate.

3. The laser system of claim 1 further including a compensating lens mounted to compensate for astigmatism in the output light from the diode laser.

4. The laser system of claim 1 wherein the collimating element comprises a spherical lens.

5. The laser system of claim 1 wherein the diode laser provides two spatially diverging output beams on two beam paths, wherein there are two diffraction gratings, each mounted to intercept the beam on one of the beam paths, the gratings partially reflecting the beam on each beam path back on the beam path through the collimating lens to focus the light back onto the position in the diode laser from which the light on that beam path originated.

6. The laser system of claim 5 including a polarization rotation element mounted in each of the two beam paths to control the amount of feedback from the gratings to the diode laser.

7. A method of narrowing the spectral width of the output of a high power diode laser that produces multimode laser light output at power levels of at least one watt having a relatively broad spectral range, comprising:
    (a) receiving the output of the diode laser with a collimating element to provide a collimated output beam; and
    (b) directing the collimated output beam to a diffraction grating mounted to receive the collimating beam from the collimated element on a beam path, and directing a portion of the beam from the grating back on the beam path to the collimating element and focusing the beam on the diode laser to provide feedback thereto to narrow the spectral range of the laser light output, selecting the amount of light directed back by the diffraction grating to the diode laser to provide effective feedback without damaging the diode laser by passing the light on the beam path through a polarization rotation element, and rotating the polarization rotation element about an axis parallel with the output beam from the collimating element to select the amount of feedback to the diode laser.

8. The method of claim 7 wherein the polarization rotation element through which the light is passed is a half wave plate.

9. A method of narrowing the spectral width of the output of a high power diode laser that produces multimode laser light output at power levels of at least one watt having a relatively broad spectral range that includes a wavelength at which a selected gas can be laser polarized, comprising:
    (a) receiving the output of the diode laser with a collimating element to provide a collimated output beam;
    (b) directing the collimated output beam to a diffraction grating mounted to receive the collimated beam from the collimating element on a beam path, and directing a portion of the beam from the grating back on the beam path to the collimating element and focusing the beam on the diode laser to provide feedback thereto to narrow the spectral range of the laser light output, such that the spectral range is centered at the wavelength at which the selected gas can be polarized, and
    (c) passing the output light beam from the diffraction grating into a cell containing a sample of the selected gas to laser polarize the gas.

10. The method of claim 9 wherein the gas is selected from the group consisting of xenon, helium, mixtures of xenon and rubidium, mixtures of helium and rubidium, mixtures of cesium and xenon, and mixtures of potassium and helium.

11. The method of claim 7 including directing a portion of the beam from the diffraction grating to provide a useable output light beam.

* * * * *